United States Patent
Reed et al.

(10) Patent No.: US 7,592,822 B2
(45) Date of Patent: Sep. 22, 2009

(54) PROBING ADAPTER FOR A SIGNAL ACQUISITION PROBE HAVING PIVOTING, COMPLIANT, VARIABLE SPACING PROBING TIPS

(75) Inventors: Gary W. Reed, Beaverton, OR (US); Paul G. Chastain, Portland, OR (US); Ira G. Pollock, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 21 days.

(21) Appl. No.: 11/958,213

(22) Filed: Dec. 17, 2007

(65) Prior Publication Data

US 2009/0153159 A1 Jun. 18, 2009

(51) Int. Cl.
*G01R 31/067* (2006.01)
(52) U.S. Cl. .................... 324/754; 324/761
(58) Field of Classification Search ........... None
See application file for complete search history.

(56) References Cited

U.S. PATENT DOCUMENTS

| | | | |
|---|---|---|---|
| 6,023,171 A * | 2/2000 | Boyette et al. ........... 324/754 |
| 6,276,956 B1 * | 8/2001 | Cook ........................ 439/482 |
| 6,462,529 B1 * | 10/2002 | Campbell ................. 324/72.5 |
| 6,828,768 B2 | 12/2004 | McTigue | |
| 7,017,435 B2 | 3/2006 | Pooley et al. | |
| 7,056,134 B2 | 6/2006 | Martin et al. | |
| 7,102,370 B2 | 9/2006 | Cannon et al. | |
| 7,212,018 B2 | 5/2007 | Annichiarico et al. | |
| 2007/0063714 A1 | 3/2007 | McTigue | |

* cited by examiner

*Primary Examiner*—Vinh P Nguyen
(74) *Attorney, Agent, or Firm*—William K. Bucher

(57) ABSTRACT

A probing adapter has a support member receiving a probing tip assembly having probing arms. The probing tip assembly is mounted to the support member via a rotational joint having elastomeric member disposed in the probing arms with each of the probing arms having a pivot point disposed away from the rotational joint. Each of the probing arms supports a removable probing tip substrate having a probing tip at one end electrically coupled via an electrical signal conductor to an electrical connector at the other end. Substrate retention clips secure the removable probing tip substrates to the probing arms. A probing tip positioning member is mounted to the probing arms for varying the distance between the probing tips on the removable probing tip substrates.

18 Claims, 4 Drawing Sheets

PROBING ADAPTER FOR A SIGNAL ACQUISITION PROBE HAVING PIVOTING, COMPLIANT, VARIABLE SPACING PROBING TIPS

BACKGROUND OF THE INVENTION

Signal acquisition probes used with signal measurement instruments, such as oscilloscopes, logic analyzers and the like have a probe body with single ended or differential probing tips extending from one end of the probe body and a signal cable extending from the other end of the probe body. The single ended or differential proving tips are coupled to passive circuitry or passive/active circuitry within the probe body. The circuitry within the probe body conditions the signal under test for coupling to the signal measurement instrument via the signal cable. Signal acquisition probes of this design have a maximum bandwidth in the range of 6 GHz.

The frequency output and response of electronic circuits continues to increase. Further, the separation between circuit components, circuit traces, electrical contact pads and the like in circuit board layouts continue to decrease. These developments require the use of signal acquisition probes having reduced size and increased bandwidth for coupling signals under test to signal measurement instruments. Signal acquisition probes with probe tips extending from the probe body are bulky and cumbersome to use on these types of circuit boards.

The highest bandwidth of signal acquisition probes used with real time digital oscilloscopes range from 13 to 16 GHz. The design of these high frequency signal acquisition probes differs from the design of previous signal acquisition probes. Because of the gigahertz frequencies these probes acquire, the signal under test need to be launched into a coaxial signal path to prevent degradation and loss of fidelity of the test signal. These high frequency signal acquisition probes have a probe body with one or more coaxial cables extending from one end. The free end(s) of the coaxial cable(s) are coupled to probing tip(s) having associated electrical circuitry. The signal(s) under test are acquired at the probing tip(s) and coupled through the electrical circuitry of the probing tip(s) into the coaxial cable(s). The coaxial cable(s) couple the acquired signal(s) under test to active circuitry in the probing head. The active circuitry condition(s) the acquired signal(s) and couples the resulting signal(s) to the oscilloscope.

U.S. Pat. Nos. 7,056,134 and 7,017,435 teach a probing tip system for a signal acquisition probe and a hand held probing adapter for the signal acquisition probe. The coaxial cables exit directly from the probe body with the coaxial cables coupled to a probing tip member. The probing tip member includes circuitry coupled to the coaxial cables and to the probing tips. Various types of probing tip(s) may be positioned on the probing tip member to allow soldering of the probing tip(s) to electrical contacts on the device under test. Variable spacing probing tips may be placed on the probing tip member with the probe body and the probing tip member being secured into a probing adapter for hand-held probing. The probing adapter has elastomeric compliant members disposed against the probing tip member to allow for axial and lateral rotation displacement of the probing tip member.

U.S. Published Patent Application No. 2007/0063714 shows coaxial connectors mounted on the probe body with the coaxial connectors coupled to the active circuitry in the probe body. The coaxial connectors mate with corresponding coaxial connectors disposed on the ends of semi-rigid coaxial cables. The other ends of each of the coaxial cables are coupled to an impedance element, such as a resistor, which is coupled to a probing tip. Each semi-rigid coaxial cable has a spring portion disposed between the probe tip and the coaxial connector. Pressure placed on the probe tips results in some give within the spring portion permitting some compliance to maintain contact with test points on the device under test in the presence of normal hand movement. Each semi-rigid coaxial cable has a slider on it that moves along the semi-rigid coaxial cable and a retention loop disposed close to the probing tip. A ground wire passes through the retention loops and is secured to the sliders on each of the semi-rigid coaxial cables. Moving the sliders along the semi-rigid coaxial cables decreases or increases the spacing between the retention loops which in turn decreases or increases the spacing between the probing tips.

U.S. Pat. No. 7,102,370 describes a compact micro-browser for hand held probing. The micro-browser has a pair of sleeves disposed in a grip shaped to be rotated between the thumb and finger. A pair of rods are retained in bores in the sleeves with a circuit board soldered to the distal ends of each rod. Each circuit board has a coupling network with on end connected to a probing tip and the other end coupled to a length of coaxial cable that passes through an axial slot in grip. The other end of the coaxial cables have coaxial connectors that mate with corresponding coaxial connectors in a probe body, such as described in of U.S. Published Patent Application No. 2007/0063714. One of the rods is allowed to rotate within its bore in the sleeve, while the other is held stationary by a notch in the sleeve. The rotatable rod has a captive spring that resists the force of the probe contact. The distance between the probing tips is a function of the amount of rotation of the grip.

U.S. Pat. No. 7,212,018 describes a dual probe tip having a tip portion of a probe and a rigid portion where a locking mechanism selectively fixes and allows movement of the tip portion relative to the rigid portion. The tip portion has a pair of probe support arms joined together at one end of the probing arms. Disposed at the other end of the probing arms are probing tips that are connected to a flex circuit having a flex bridge for placing the flex circuitry along both arms. The flex circuitry extends along the inner surface of one of the probe arms with the end of the flex circuitry terminating an external coupler. An arm positioning mechanism is disposed between the probing arms for changing the relative positions of the probing tip to each other. The locking mechanism is fixed to one end of the rigid member and includes a ball joint having an extension on which the probe support arms are secured. A number of embodiments are described for locking and releasing the ball joint. Releasing pressure on the ball joint allows the movement of the probing tips mounted on the probe support arms relative to the rigid portion. Applying pressure on the ball joint locks the probe support arms relative to the rigid portion.

Each of the above described devices has some form of probing tip compliance. Some have axial and lateral rotation compliance. Others rely on the flexibility of the probing tips to provide compliance while still others rely or on the flexibility of the probing tips and the structure supporting the probing tips to provide the compliance. While all of the devices provide some form of probing tip compliance, generally they provide the highest level of compliance with the probing tips vertical to probing points on a device under test. If the devices are angles to the probing points, more of the needed compliance is taken up by the probing tips themselves. Generally, it takes less downward force to bend or break probing tips when the probing tips are at an angle to the probing points than when the probing tips are vertical to the probing points. It is preferable to have a probing tip system where a single element provides substantially all of the compliance required to the probing tips.

SUMMARY OF THE INVENTION

The present invention is a probing adapter for a signal acquisition probe. The probing adapter has a support member and probing tip assembly that is rotatable in an arc of approximately 120° via a rotational joint. First and second probing arms each have an aperture formed therein with an elastomeric member disposed in the apertures of the probing arms. The elastomeric member is preferably an elastomeric bushing having a central aperture and a plurality of additional apertures surrounding the central aperture. Each probing arm supports a removable probing tip substrate having a probing tip extending from one end that is coupled via an electrical signal conductor to an electrical connector at the other end. Each probing tip arm has a pivot point disposed between the aperture and the probing tip. A probing tip positioning member is mounted to the probing arms for varying the distance between the probing tips on the removable probing tip substrates.

The support member consists of a beam having opposing arms extending from one end of the beam with the opposing arms having a gap there between. Each of the opposing arms of the beam has an aperture formed therein. The probing tip assembly has a mounting hub forming a part of the rotational joint. The mounting hub has first and second sets of protrusions extending from opposing surfaces of a flat member with an aperture extending through the hub at the first set of protrusions. Each of the first set of protrusions receives an elastomeric washer positioned adjacent to opposing surfaces of the flat member, one of the first and second probing arms with the elastomeric bushing positioned adjacent to the elastomeric washer, and an outside bushing positioned adjacent to one of the respective first and second probing arms. The second set of protrusions are received in second elongate apertures formed along the first and second probing arms forming the pivot points in the first and second probing arms. The first set of protrusions are positioned between the opposing arms of the beam and a shaft of a thumb screw is inserted through the apertures of the opposing arms and the aperture in the first set of protrusions. The thumb screw has a top cap at one end of the shaft and machine threads at the other end. A washer is positioned between the top cap and one of the opposing arms of the beam and the threaded end of the shaft engages a threaded nut fixedly positioned on the other opposing arm of the beam.

Each of the probing arms has an angled flat surface disposed opposite the aperture ends of the probing arms. The flat surface extends from one of the top or bottom edges of the probing arms with the removable probing tip substrate positioned on one side of the angled flat surface.

Each of the removable probing tip substrates has opposing notches formed in the side surfaces at one end of the removable probing tip substrate and opposing offset notches formed in the side surfaces at the other end of the removable probing tip substrate. The electrical signal conductor of the removable probing tip substrate has a planar central signal conductor disposed between planar outer shielding conductors forming a coplanar transmission line. The planar central signal conductor electrically is coupled to one end of an electrical element, such as a resistive element, resistive-capacitive element or the like, mounted on the removable probing tip substrate with the other end of the electrical element electrically coupled to the probing tip. The removable probing tip substrates also have a notch formed in one end of the removable probing tip substrate for receiving one end of the probing tip. The end of the probing tip is secured in the notch by an electrically conductive securing material, such as solder, electrically conductive epoxy or the like. The other end of the removable probing tip substrate has a coaxial cable connector having a central signal conductor electrically coupled to the planar central signal conductor of the substrate and an outer shielding conductor electrically coupled to the planar outer shielding conductors on the substrate. The removable probing tip substrate may be formed of high performance circuit board material.

The removable probing tip substrates are secured to the flat surfaces of the probing arms using substrate retention clips. Each substrate retention clips has a flat surface with opposing spring arms extending from one end of the flat surface and opposing offset spring arms at opposite end of the flat surface. The substrate retention springs are positioned on the other side of the angled flat surfaces of the probing arms with the spring arms engaging the notches formed on the side surfaces of the removable probing tip substrate to secure the removable probing tip substrates to the angled flat surfaces of the first and second probing arms.

One of the probing arms has an elongate aperture formed therein and the other probing arm has a circular aperture aligned with the elongate aperture formed in the other probing arm for receiving the probe tip positioning member. The probing tip positioning member has a post having a shaft with screw threads at one end and a cap at the other end. The cap has opposing flat surfaces on a portion of the cap for engaging the elongate aperture in one of the probing arms. The post is inserted through the aligned elongate and circular apertures in the probing arms with a compression spring disposed around the shaft and between the first and second probing arms. A washer is disposed between the probing arm with the circular aperture and a thumb screw having a threaded aperture receiving the screw threads of the shaft. The washer disposed between probing arm and the thumb screw is formed of a low friction material such as TEFLON®. The flat surfaces of the cap engages the elongate aperture in the probing arm prevents the rotation of the post when turning the thumb screw for varying the distance between the probing tips on the removable probing tip substrate.

The objects, advantages and novel features of the present invention are apparent from the following detailed description when read in conjunction with appended claims and attached drawings.

DETAILED DESCRIPTION OF THE INVENTION

Figure 1:
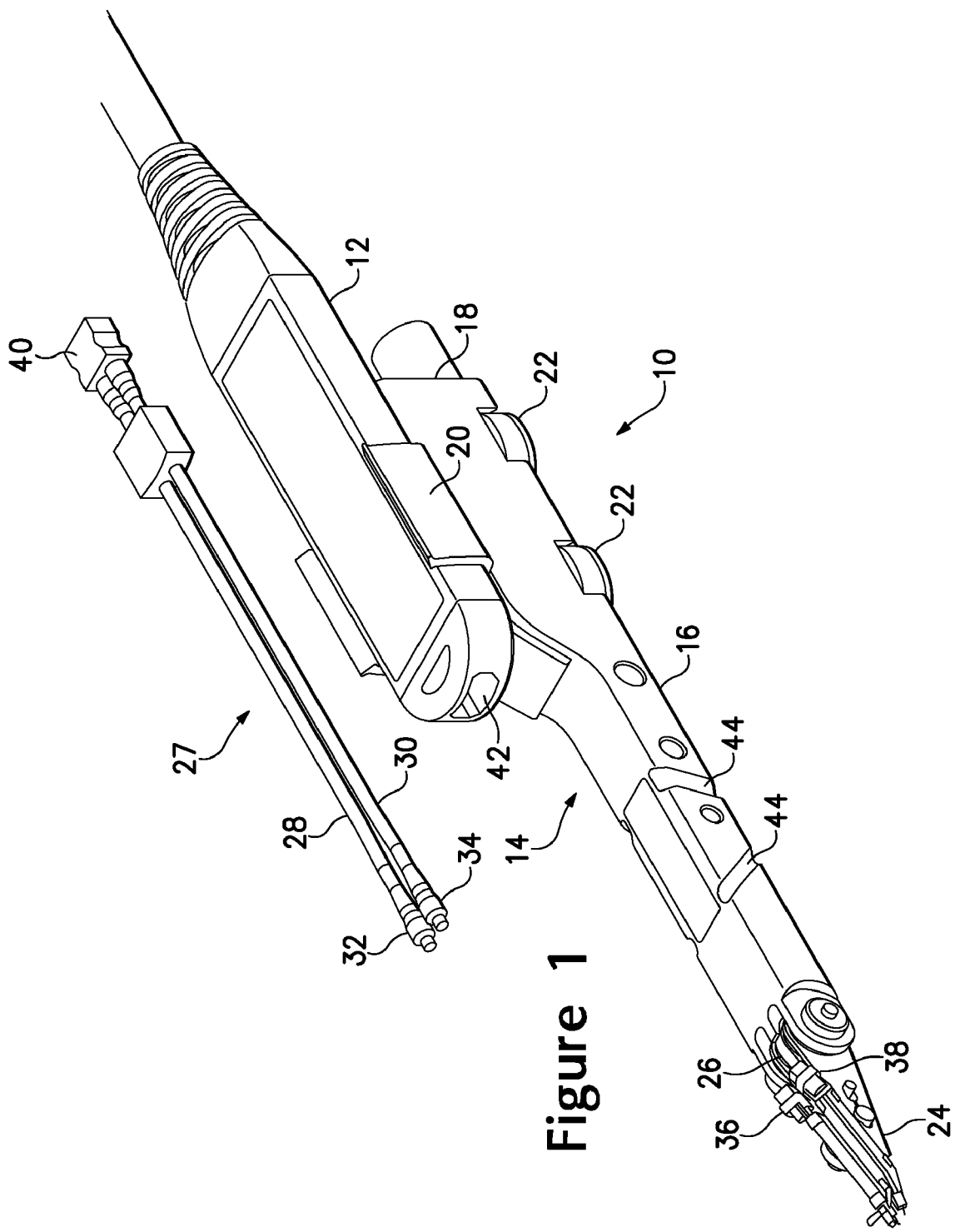
FIG. 1 is a perspective view of the probing adapter for a signal acquisition probe according to the present invention.

FIG. 1 is a perspective view of the probing adapter 10 for a signal acquisition probe 12 according to the present invention. The probing adapter 10 has a support member 14 in the form of a beam 16 that is formed of a durable, hard material, such as aluminum, PVC plastic, polycarbonate or the like. The beam 16 has a raised portion 18 where the signal acquisition probe 12 is selectively secured to the beam 16 using a removable probe retention clip 20. The retention clip 20 is positioned in a slot (not shown) formed in the top of the raised portion and secured in place using thumb screws 22 extending through the beam 16 and into the slot. A probing tip assembly 24 extends from the beam 16 and is secured to the beam 16 via a rotational joint 26. The signal acquisition probe 12 is coupled to the probing tip assembly 24 via a coaxial cable assembly 27 having first and second coaxial cables 28 and 30. Each of the coaxial cables 28 and 30 has a coaxial cable connector 32, 34 at one end for coupling to electrical connectors 36, 38 on the probing tip assembly 24. The other ends of the coaxial cables 28, 30 are disposed in a dual coaxial connecting member 40 that makes coaxial connections with a dual coaxial connecting member 42 in the signal acquisition probe 12. Angled slots 44 are formed on either side of the beam 16 for routing the coaxial cables 28 and 30 from the probing tip assembly 24 to the signal acquisition probe 12.

Figure 2:
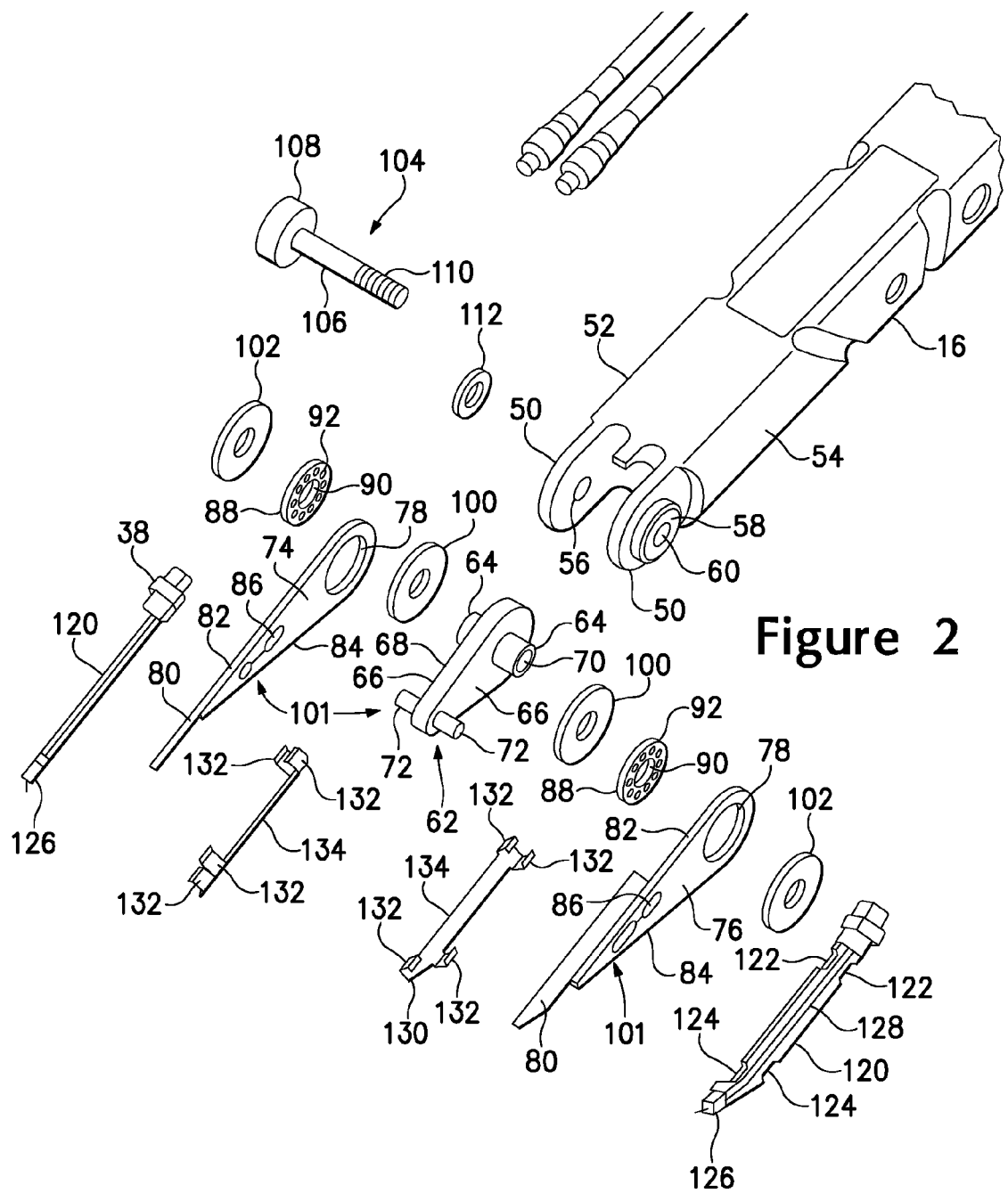
FIG. 2 is an exploded perspective of the view of the probing adapter for a signal acquisition probe according to the present invention.

FIG. 2 is an exploded perspective view of the probing adapter 10 showing the beam 16 and the probing tip assembly 24. The beam 16 has opposing arms 50 extending from side surfaces 52 and 54 of the beam 16. Each of the opposing arms has an aperture 56 formed therein. A nut 58 having a threaded aperture 60 is press fit into one of the opposing arms 50.

The probing tip assembly 24 has a hub 62 with a first set of protrusions 64 extending from opposing surfaces 66 of a flat member 68. A bore 70 is formed in the hub 62 that extends through the first set of protrusions 64. A second set of protrusions 72 extend from the opposing surfaces 66 of the flat member 68. The hub 62 is preferably made of stainless steel or similar metal products. The probing tip assembly 24 further has first and second probing arms 74 and 76 with each probing arm 74, 76 having an aperture 78 formed in one end and an angled flat surface 80 extending along the top or bottom edges 82, 84 at the other end. The probing arms 74, 76 are preferably formed of an electrically conductive material, such as beryllium-copper or the like. A second set of elongate apertures 86 are formed along each of the probing arms 74, 76. Elastomeric bushings 88 are positioned in the apertures 78 of the probing arms 74, 76. Each elastomeric bushing 88 has a central aperture 90 surrounded by a plurality of additional apertures 92. Each of the plurality of apertures 92 may take a different shape, such as a circle, ellipses, tear shaped, various polygonal shapes, machine like teeth formed adjacent to the outer edge bushing or the like.

The rotational joint 26 is constructed by placing various probing tip assembly 24 elements on each of the protrusions of the first set of protrusions 64 of the hub 62 and securing the hub 62 between the opposing arms 50 of the beam 16. Each of the protrusions of the first set of protrusion 64 receives an elastomeric washer 100 that is positioned adjacent to the flat surface 66 of the hub 62. One of the first and second probing arms 74, 76 is placed on each protrusion 64 adjacent to the elastomeric washers 100 with the elastomeric bushings 88 positioned between each of the probing arms 74, 76 and the protrusions 64. The second set of protrusions 72 on the hub 62 are inserted into the elongate aperture 86 along each of the probing arms 74, 76 forming pivot points 101 in the first and second probing arms 74, 76. Outer washers 102 are positioned on the protrusions 64 adjacent to each of the probing arms 74, 76. The hub 62 with the assembled elements of the probing tip assembly 24 on the first set of protrusions 64 is positioned between the opposing arms 50 of the beam 16 and secured in place by the a thumb screw 104 having a shaft 106 with a cap 108 at one end and machine threads 110 at the other end. A washer 112 is positioned on the shaft 106 adjacent to the cap 108 and the shaft 106 of the thumb screw 104 is inserted through the aperture 56 in the opposing arms 50 of the beam 16 and the aperture 70 in the hub 62. The machine threads 110 of the shaft 106 are screwed into threaded aperture 60 of the nut 58 on one of the opposing arms 50 of the beam 16. The thumb screw 104 is tightened to lock the probing tip assembly 24 in a desired position. The thumb screw 104 is loosened to allow the probing tip assembly 24 to rotate about the thumb screw shaft 106 in an arc of approximately 120° and tightened to lock the probing tip assembly 24 in a desired position.

A removable probing tip substrate 120 is supported on each of the flat surfaces 80 of the first and second probing arms 74, 76. Each removable probing tip substrate 120 has opposing notches 122 formed in the side surfaces at one end of the removable probing tip substrate 120. Opposing offset notches 124 are formed in the side surfaces at the other end of the removable probing tip substrate 120. The removable probing tip substrates 120 are preferably formed of a high performance circuit board material with each substrate 120 having a probing tip 126 at one end respectively coupled via an electrical signal conductor 128 to the electrical connectors 36 and 38 at the other end. The removable probing tip substrates 120 are secured to the angled flat surfaces 80 of the probing arms 74, 76 by substrate retention clips 130. The substrate retention clips 130 have spring arms 132 extending from a flat surface 134 that correspond to the locations of notches 122, 124 in the removable probing tip substrate 120. The substrate retention clips 130 are positioned on the other side of the flat surfaces 80 of the probing arms 74, 76 with the spring arms 132 engage the notches 122, 124 in the removable probing tip substrate 120. The substrate retention clips 130 allow easy replacement of the removable probing tip substrates 120 if and when a substrate is damaged.

Figure 3:
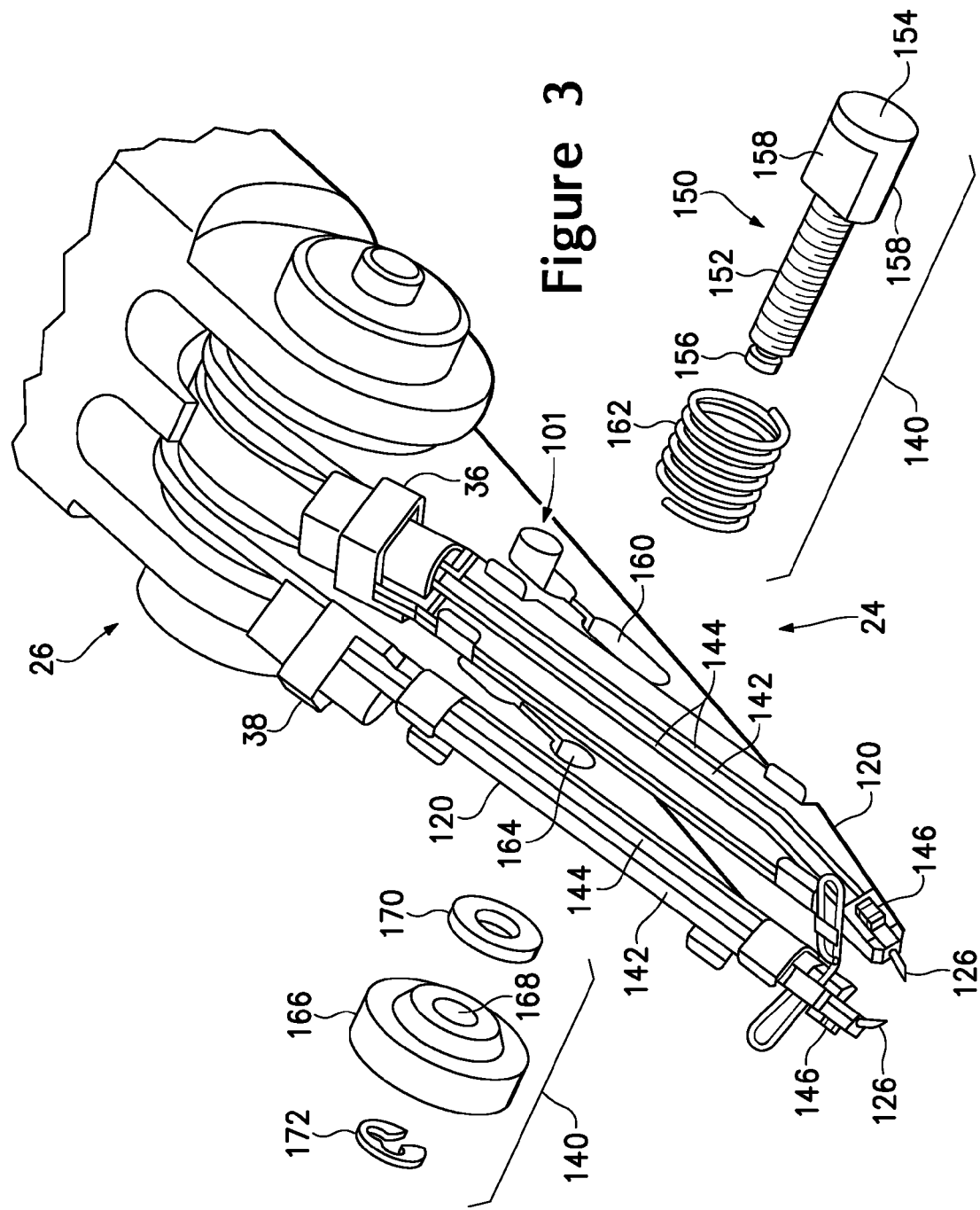
FIG. 3 is a perspective of the probing tip assembly and an exploded perspective view of the probing tip positioning member of the probing adapter for a signal acquisition probe according to the present invention.

FIG. 3 shows a perspective view the probing tip assembly 24 and an exploded perspective view of components of a probing tip positioning member 140. The electrical signal conductor 128 on each of the removable probing tip substrates 120 has a planar central signal conductor 142 disposed between planar outer shielding conductors 144 forming a grounded coplanar transmission line. Each of the planar central signal conductors 142 is electrically coupled to one end of an electrical element 146 mounted on the removable probing tip substrates 120. The electrical element 146 is preferably a resistive element, such as a resistor. The electrical element 146 may also take the form of a passive electrical circuit having resistive, capacitive and/or inductive elements. The electrical element 146 may further take the form of active circuitry having an active circuit component, such as an amplifier or the like. The other end of each of the electrical components 146 is electrically coupled to one of the respective probing tips 126. The opposing end of each of the planar central signal conductors 142 is coupled to a central signal conductor of one of the respective electrical connectors 36 and 38 with the planar outer shielding conductors 144 electrically coupled to the outer shielding conductor of one of the electrical connectors 36 and 38. The electrical connectors 36 and 38 are preferably coaxial cable connectors that mates with the coaxial cable connectors 32 and 34 on coaxial cables 28 and 30. The opposite surfaces of the removable probing tip substrates 120 have metallization deposited thereon to provide a ground plane for the grounded coplanar transmission line and electrically couple the removable probing tip substrate 120 to the flat surfaces 80 of the probing arms 74, 76.

The probing tip positioning member 140 has a post 150 with a threaded shaft 152 having a cap 154 at one end and a groove 156 formed in the other end. The cap 154 has opposing flat surfaces 158 formed on a portion of the cap 154 forming an oval shape. An aperture 160 is formed in one of the probing arms 74, 76 having an oval portion and a rounded portion forming a shoulder in the aperture 160. A compression spring 162 is disposed between the probing arms 74, 76 with the threaded shaft 152 of the post 150 extending through the compression spring 162. The oval portion of the cap 152 is positioned within the oval portion of the aperture 160 with the threaded shaft 152 passing through the rounded portion of the aperture 160. The groove 156 end of the threaded shaft 152 passes through a rounded aperture 164 formed in the other of the probing arms 74, 76 that is aligned with oval aperture 160. A thumb screw 166 having a threaded aperture 168 is threaded on the threaded shaft 152 capturing a low friction washer 170, such as a TEFLON® washer, between the thumb screw 166 and the other of the probing arms 74, 76. A retaining ring 172, such as an E-ring 172, is positioned in the groove 156 formed in the threaded shaft to secure the elements 150, 162, 166, 170 of the probing tip positioning member 140 to the probing tip assembly 24. The oval portion of the cap 154 engaging the oval portion of the aperture 160 prevents the post 150 from rotating while the thumb screw 166 is turned to vary the distance between the probing tips 126 on the removable probing tip substrate 120.

Figure 4:
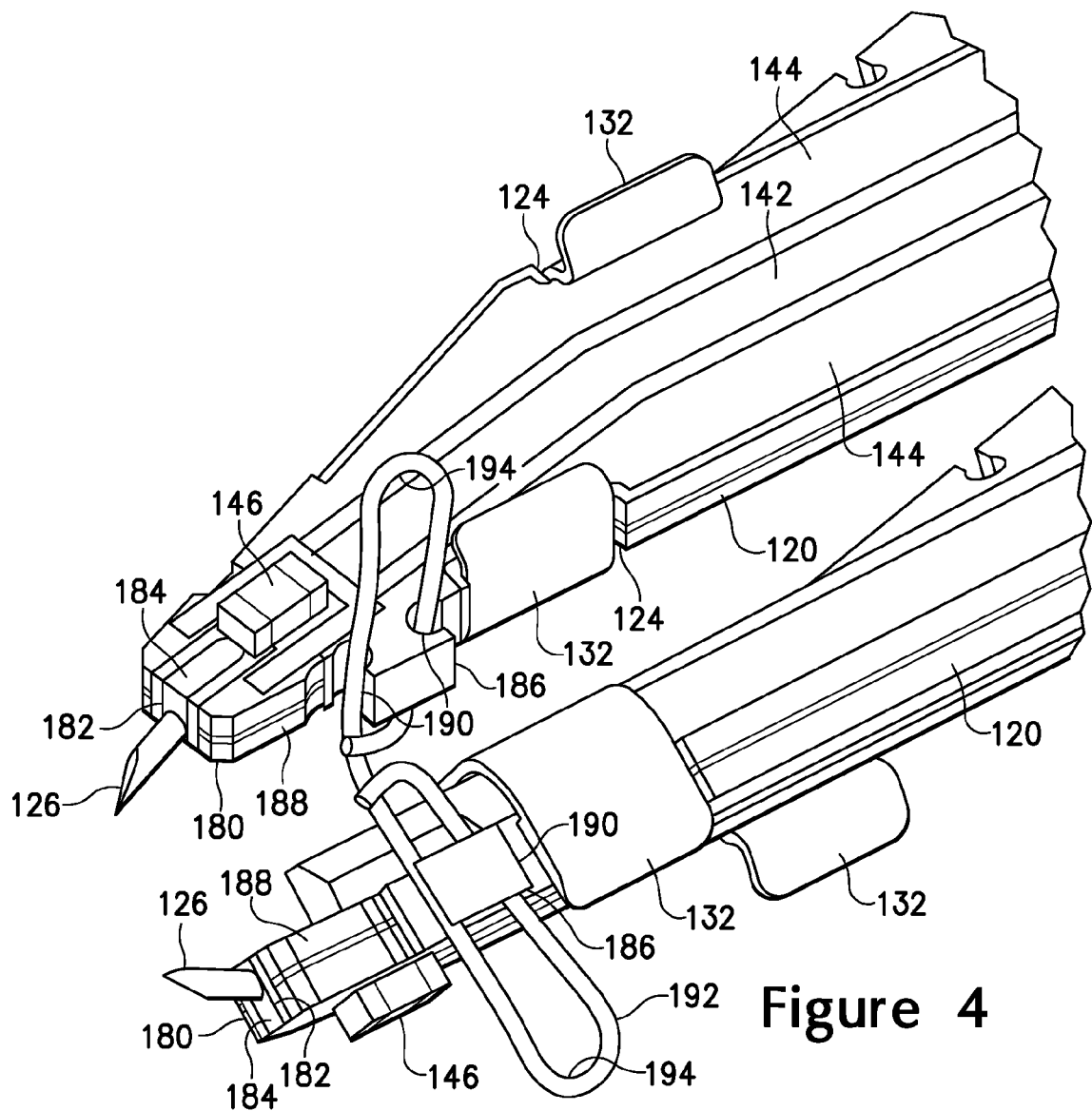
FIG. 4 is a more detailed perspective view the front portion of the removable probing tip substrate of the probing adapter for a signal acquisition probe according to the present invention.

FIG. 4 is a perspective view showing the front portion of the probing tip assembly 24. The removable probing tip substrates 120 are shown with the planar central signal conductor 142 plainly seen on one of the substrates 120. Each of the removable probing tip substrates 120 has a front portions 180 with a notch 182 formed therein. The probing tips 126 are positioned and secured in the notches 182 with an electrically conductive securing material 184, such as solder, electrically conductive epoxy or the like. The electrically conductive securing material 184 electrically couples the probing tips 126 to the one end of the electrical elements 146. Each of the removable probing tip substrates 120 has an electrically conductive attachment post 186 disposed proximate to the front portion 180 and extending from adjacent side surfaces 188 of the removable probing tip substrate 120. Each of the electrically conductive attachment posts 186 has indented side surfaces 190 for receiving an electrically conductive ground contact 192. The electrically conductive ground contact 192 has opposing loop portions 194 with each loop portion 194 engaging one of the electrically conductive attachment posts 186. The loop portions 194 of the electrically conductive ground contact slide along the electrically conductive attachment post 184 as the probing tip positioning member 140 varies the distance between the probing tips 126.

The probing tip assembly 24 may be rotated about the rotational joint 26 to orient the probing arms 74, 76 relative to probing points on a device under test. The thumb screw 104 of the rotational joint 26 is loosened to allow the rotation of the probing tip assembly 24. When the thumb screw 104 is tightened, it locks the hub 62 in place by the friction applied between the first set of protrusions 64 on the hub 62 and the opposing arms 50 of the beam 16. Without the support arms 74, 76 having the pivot point 101, the probing arms 74, 76 would be free to rotate about the first set of protrusions 64 on the hub 62 when a downward force is applied to the probing arms 74, 76. The pivot point 101 locks the probing arms 74, 76 relative to the rotational joint 26. Downward pressure on the probing arms 74, 76 rotates the probing arms 74, 76 about the pivot point 101 with the compliance of the probing tips 126 on the probing arms 74, 76 being provided by the elastomeric bushings 88 in the probing arms 74, 76.

The inclusion of the plurality of apertures 92 in the elastomeric bushing 88 decreases the Shore A rating of the elastomeric bushings 88. The softest elastomer available for the probing adapter 10 has a durometer Shore A rating of 50. The plurality of apertures 92 in the elastomeric bushings 88 has the effect of decreasing the Shore A rating of the elastomeric bushings 88 to increase probing tip compliance for the same amount of force applied to the probing tips 126. The elastomeric bushings 88 within the apertures 78 of the probing arms 74 and 76 and around the axis of the rotational joint 26 absorb the deflections of the probing arms 74, 76 and the probing tips 126 irrespective of the angle of the probing arms 74, 76 have to probing points on a device under test and the differences in height of the probing points to the probing tips 126.

It will be obvious to those having skill in the art that many changes may be made to the details of the above-described embodiments of this invention without departing from the underlying principles thereof. The scope of the present invention should, therefore, be determined only by the following claims.

What is claimed is:

1. A probing adapter for a signal acquisition probe comprising:
   a support member; and
   a probing tip assembly having first and second probing arms, a mounting hub, removable probing tip substrates, and a probing tip positioning member with each of the first and second probing arms having a first aperture disposed at one end receiving elastomeric member and an elongate second aperture formed along the probing arm;
   the mounting hub having first and second sets of protrusion extending from opposing surfaces of a flat member with the first set of protrusions having a bore extending there through with the first and second probing arms disposed on the first set of protrusions on either side of the flat member via the first apertures, and the second set of protrusions of the mounting hub disposed in the elongate second apertures of the first and second probing arms forming a pivot point for the first and second probing arms of the probing tip assembly;
   the removable probing tip substrates having a probing tip at one end electrically coupled via a electrical signal conductor to an electrical connector at the other end with each removable probing tip substrate disposed on one of the first and second probing arms; and
   the probing tip positioning member mounted to the first and second probing arms for varying the distance between the probing tips on the removable probing tip substrates;
   the probing tip assembly mounted to the support member using the first protrusions of the mounting hub to form a rotational and selectively locked joint allowing the second set of protrusions of the mounting hub to function as pivot point for the first and second probing arms.

2. The probing adapter as recited in claim 1 wherein the support member further comprises a beam having opposing arms extending from one end of the beam with the opposing arms having a gap there between for receiving the first protrusions of the mounting hub, and each opposing arm having an aperture therein.

3. The probing adapter as recited in claim 1 wherein each of the elastomeric member disposed in the first and second probing arms comprise an elastomeric bushing disposed in each of the first apertures of the first and second probing arms with each of the elastomeric bushings having a central aperture and a plurality of additional apertures surrounding the central aperture.

4. The probing adapter as recited in claim 3 wherein the rotational and selectively locked joint further comprises each protrusion of the first set of protrusions of the mounting hub receiving an elastomeric washer positioned adjacent to one of the flat surfaces, one of the first and second probing arms with the elastomeric bushing, and an outer bushing positioned adjacent to one of the respective first and second probing arms.

5. The probing adapter as recited in claim 4 wherein the rotational and selectively locked joint further comprises a thumbscrew having a shaft with one end being threaded and the other having a cap, the shaft extending through the apertures in the opposing arms of the beam and the bore of the first set of protrusions of the mounting hub with the threaded end of the shaft engaging a threaded nut positioned on the other opposing arm of the beam.

6. The probing adapter as recited in claim 1 wherein the each of the first and second probing arms further comprises an angled flat surface disposed at the other end of each of first and second probing arms and extending from one of the top and bottom edges of each of the first and second probing arms with one of the removable probing tip substrates positioned on one side of each of the angled flat surfaces.

7. The probing adapter as recited in claim 6 wherein each of the removable probing tip substrates further comprises opposing notches formed in the side surfaces at one end of the removable probing tip substrate and opposing offset notches formed in the side surface of the removable probing tip substrate at the other end of the substrate with the electrical signal conductor being a planar central signal conductor disposed between planar outer shielding conductors with the planar central signal conductor electrically coupled to one end of an electrical element mounted on the removable probing tip substrate and the other end of the electrical element electrically coupled to the probing tip.

8. The probing adapter as recited in claim 7 wherein the electrical element is a resistive element.

9. The probing adapter as recited in claim 7 wherein each of the removable probing tip substrates further comprises a notch formed in the end of the removable probing tip substrate for receiving the one end of the probing tip, with the end of the probing tip secured in the notch by an electrically conductive securing material.

10. The probing adapter as recited in claim 9 wherein the electrically conductive securing material is solder.

11. The probing adapter as recited in claim 9 wherein the electrically conductive securing material is an electrically conductive epoxy.

12. The probing adapter as recited in claim 7 wherein each of the electrical connectors on the removable probing tip substrates further comprises a coaxial cable connector having a central signal conductor electrically coupled to the planar central signal conductor of the substrate and an outer shielding conductor electrically coupled to the planar outer shielding conductors on the substrate.

13. The probing adapter as recited in claim 7 wherein the removable probing tip substrate is formed of circuit board material.

14. The probing adapter as recited in claim 7 further comprising substrate retention clips with each substrate retention clips having a flat surface with opposing spring arms extending from the flat surface at one end of the flat surface and opposing offset spring arms extending from the other end of the flat surface, the substrate retention springs positioned on the opposing sides of the angled flat surfaces of the first and second probing arms with the spring arms engaging the notches formed on the side surfaces of the removable probing tip substrates to secure the removable probing tip substrates to the angled flat surfaces of the first and second probing arms.

15. The probing adapter as recited in claim 1 wherein the first and second probing arms have an elongate aperture formed in one of the first and second probing arms and a circular aperture aligned with the elongate aperture formed in the other of the first and second probing arms.

16. The probing adapter as recited in claim 15 wherein the probing tip positioning member further comprises a post having a shaft with a cap at one end and screw threads at the other end inserted through the aligned elongate and circular apertures in the first and second probing arms with a compression spring disposed around the shaft and between the first and second probing arms with a washer disposed between one of the first and second probing arms and a thumb screw having a threaded aperture receiving the screw threads of the shaft.

17. The probing adapter as recited in claim 16 wherein the post cap further comprises opposing flat surface formed in a portion of the cap for engaging the elongate aperture in one of the first and second probing arms for preventing rotation of the post when turning the thumb screw for varying the distance between the probing tips on the removable probing tip substrate 18. The probing adapter as recited in claim 16 wherein the washer disposed between one of the first and second probing arms and the thumb screw is a low friction material.

* * * * *